(12) United States Patent
Jeong

(10) Patent No.: US 9,336,839 B2
(45) Date of Patent: May 10, 2016

(54) INTEGRATED CIRCUIT AND MEMORY DEVICE

(71) Applicant: SK hynix Inc., Gyeonggi-do (KR)

(72) Inventor: Chun-Seok Jeong, Gyeonggi-do (KR)

(73) Assignee: SK Hynix Inc., Gyeongi-do (KR)

( * ) Notice: Subject to any disclaimer, the term of this patent is extended or adjusted under 35 U.S.C. 154(b) by 120 days.

(21) Appl. No.: 14/465,514

(22) Filed: Aug. 21, 2014

(65) Prior Publication Data

US 2015/0179237 A1 Jun. 25, 2015

(30) Foreign Application Priority Data

Dec. 20, 2013 (KR) ........................ 10-2013-0159855

(51) Int. Cl.
| | | |
|---|---|---|
| G11C 7/22 | (2006.01) | |
| G11C 7/10 | (2006.01) | |
| G11C 7/20 | (2006.01) | |
| G11C 29/00 | (2006.01) | |
| G11C 29/44 | (2006.01) | |

(52) U.S. Cl.
CPC .............. *G11C 7/106* (2013.01); *G11C 7/1066* (2013.01); *G11C 7/20* (2013.01); *G11C 7/222* (2013.01); *G11C 29/78* (2013.01); *G11C 2029/4402* (2013.01)

(58) Field of Classification Search
CPC ........................................................ G11C 7/22
USPC ................................................ 365/189.011
See application file for complete search history.

(56) References Cited

U.S. PATENT DOCUMENTS

| | | | |
|---|---|---|---|
| 6,667,901 B1 | 12/2003 | Perner et al. | |
| 6,777,757 B2 | 8/2004 | Peng et al. | |
| 6,940,751 B2 | 9/2005 | Peng et al. | |
| 7,173,851 B1 | 2/2007 | Callahan et al. | |
| 7,269,047 B1 | 9/2007 | Fong et al. | |
| 2008/0056019 A1* | 3/2008 | Kim .......................... | G11C 7/22 365/189.05 |
| 2008/0204103 A1* | 8/2008 | Jung ......................... | G06F 1/10 327/288 |
| 2008/0278997 A1* | 11/2008 | Katagiri ............... | G11C 7/1072 365/163 |
| 2012/0092947 A1* | 4/2012 | Kim ...................... | G11C 17/165 365/225.7 |
| 2012/0120753 A1* | 5/2012 | Fujisawa .................. | G11C 8/18 365/230.06 |
| 2012/0191388 A1* | 7/2012 | Parle ................ | G01R 31/31703 702/63 |
| 2013/0322183 A1* | 12/2013 | Jeong ....................... | G11C 8/00 365/189.05 |
| 2014/0022856 A1* | 1/2014 | Jung ..................... | G11C 7/1006 365/189.12 |
| 2014/0104966 A1* | 4/2014 | Oh ......................... | G11C 16/20 365/189.12 |

* cited by examiner

Primary Examiner — Min Huang
(74) Attorney, Agent, or Firm — IP&T Group LLP

(57) ABSTRACT

An integrated circuit may include a nonvolatile memory circuit, a data bus suitable for transferring data outputted from the nonvolatile memory circuit, a shift register suitable for sequentially activating first to $N^{th}$ selection signals whenever a clock is activated, and first to $N^{th}$ latch circuits corresponding to the first to $N^{th}$ selection signals, respectively, and suitable for storing data of the data bus in response to activation of one or more of the first to $N^{th}$ selection signals.

14 Claims, 7 Drawing Sheets

INTEGRATED CIRCUIT AND MEMORY DEVICE

CROSS-REFERENCE TO RELATED APPLICATIONS

The present application claims priority of Korean Patent Application No. 10-2013-0159855, filed on Dec. 20, 2013, which is incorporated herein by reference in its entirety.

BACKGROUND

1. Field

Exemplary embodiments of the present invention relate to an integrated circuit and a memory device, and more particularly, to an integrated circuit and a memory device to perform a boot-up operation for transmitting data from a nonvolatile memory to latch circuits.

2. Description of the Related Art

FIG. 1 is a block diagram illustrating a repair operation of a conventional memory device.

Referring to FIG. 1, the memory device includes a cell array 110 including a plurality of memory cells, a row circuit 120 for activating a word line selected by a row address R_ADD, and a column circuit 130 for accessing (reading or writing) data of a bit line selected by a column address C_ADD.

A row fuse circuit 140 stores a row address, which corresponds to a failed memory cell in the cell array 110, as a repair row address REPAIR_R_ADD. A row comparison unit 150 compares the repair row address REPAIR_R_ADD stored in the row fuse circuit 140 with a row address R_ADD inputted from an exterior of the memory device. When the repair row address REPAIR_R_ADD coincides with the row address R_ADD, the row comparison unit 150 controls the row circuit 120 to activate a redundancy word line instead of a word line designated by the row address R_ADD.

A column fuse circuit 160 stores a column address, which corresponds to a failed memory cell in the cell array 110, as a repair column address REPAIR_C_ADD. A column comparison unit 170 compares the repair column address REPAIR_C_ADD stored in the column fuse circuit 160 with a column address C_ADD inputted from the exterior of the memory device. When the repair column address REPAIR_C_ADD coincides with the column address C_ADD, the column comparison unit 170 controls the column circuit 130 to access a redundancy bit line instead of the bit line designated by the column address C_ADD.

The conventional fuse circuits 140 and 160 generally use a laser fuse. The laser fuse stores 'high' or 'row' data according to whether the fuse has been cut. The laser fuse is programmed at a wafer state of the memory device, but it is not possible to program the fuse after a wafer is mounted in a package. Also, it is not possible to design the laser fuse in a small area due because of pitch limitations.

In order to overcome such a problem, as disclosed in U.S. Pat. Nos. 6,904,751, 6,777,757, 6,667,902, 7,173,851, and 7,269,047, one of nonvolatile memory circuits, such as an E-fuse array circuit, a NAND flash memory, a NOR flash memory, an EPROM (Erasable Programmable Read Only Memory), an EEPROM (Electrically Erasable Programmable Read Only Memory), a FRAM (Ferroelectric RAM), or a MRAM (Magnetoresistive RAM), is included in the memory device, and repair information is stored in the nonvolatile memory circuit.

FIG. 2 is a block diagram illustrating a nonvolatile memory circuit storing repair information in a conventional memory device.

Referring to FIG. 2, the memory device includes a plurality of memory banks BK0 to BK3, latch circuits 210_0 to 210_3 provided in the memory banks BK0 to BK3 to store repair information, a latch circuit 210_4 for storing setting information, a setting circuit 220, and a nonvolatile memory circuit 201.

The nonvolatile memory circuit 201 is a substitution of the fuse circuits 140 and 160. Repair information corresponding to all the banks BK0 to BK3, that is, a repair address is stored in the nonvolatile memory circuit 201. Setting information necessary for operation of the memory device is stored in the nonvolatile memory circuit 201. The nonvolatile memory circuit 201 may include either an E-fuse array circuit, a NAND flash memory, a NOR flash memory, an EPROM, an EEPROM, a FRAM, and/or a MRAM.

The latch circuits 210_0 to 210_3 store the repair information of the memory banks BK0 to BK3, respectively, and the latch circuit 210_4 stores setting information to be used in the setting circuit 220. The setting circuit 220 may perform an operation for setting various setting values necessary for an operation of the memory device, for example, internal voltage levels and various types of latency, by using the setting information stored in the latch circuit 210_4. The repair information is loaded from the nonvolatile memory circuit 201 to the latch circuits 210_0 to 210_3 after the memory device is powered on. The nonvolatile memory circuit 201 transmits stored repair information to the latch circuits 210_0 to 210_3 from the activation time point of a boot-up signal BOOTUP.

The nonvolatile memory circuit 201 is arranged as an array, and thus it takes a predetermined time to retrieve data stored in the nonvolatile memory circuit 201. Because of the predetermined time for data retrieval, it is not possible to promptly perform a repair operation by using the data stored in the nonvolatile memory circuit 201. For prompt operation, the repair information and the setting information stored in the nonvolatile memory circuit 201 is transmitted to the latch circuits 210_0 to 210_4 for storage, and data stored in the latch circuits 210_0 to 210_4 is used for repair operations of the memory banks BK0 to BK3 and setting operations of the setting circuit 220. A process in which the repair information and the setting information stored in the nonvolatile memory circuit 201 is transmitted to the latch circuits 210_0 to 210_4 is called a boot-up, and only when the boot-up operation is completed, the memory device can repair a failed cell, perform various setting operations, and then perform a normal operation (for example, a read/write operation).

As described above, in a memory device that stores the repair information and the setting information by using a nonvolatile memory circuit 201, the boot-up operation should be performed before a normal operation of the memory device. Therefore, data must be transmitted quickly and efficiently in a boot-up operation.

SUMMARY

Various embodiments are directed to a technology for efficiently performing a boot-up operation in an integrated circuit or a memory device.

In an embodiment, an integrated circuit may include a nonvolatile memory circuit; a data bus suitable for transferring data outputted from the nonvolatile memory circuit; a shift register suitable for sequentially activating first to $N^{th}$ selection signals whenever a clock is activated; and first to $N^{th}$ latch circuits corresponding to the first to $N^{th}$ selection signals, respectively, and suitable for storing data of the data bus in response to activation of the first to $N^{th}$ selection signals.

In an embodiment, a memory device may include a nonvolatile memory circuit suitable for storing data including repair data and setting data; a data bus suitable for transferring data outputted from the nonvolatile memory circuit; a shift register suitable for sequentially activating first to $N^{th}$ selection signals whenever a clock is activated; first to $N^{th}$ latch circuits corresponding to the first to $N^{th}$ selection signals, respectively, and suitable for storing data of the data bus in response to activation of the first to $N^{th}$ selection signals; a plurality of memory banks suitable for replacing a failed cell with a redundancy cell by using data stored in one or more of the first to $N^{th}$ latch circuits; and a setting circuit suitable for performing a setting operation by using the data stored in one or more of the first to $N^{th}$ latch circuits.

According to the embodiments of the present invention, it is possible to transmit data quickly and efficiently in a boot-up operation.

DETAILED DESCRIPTION

Figure 1:
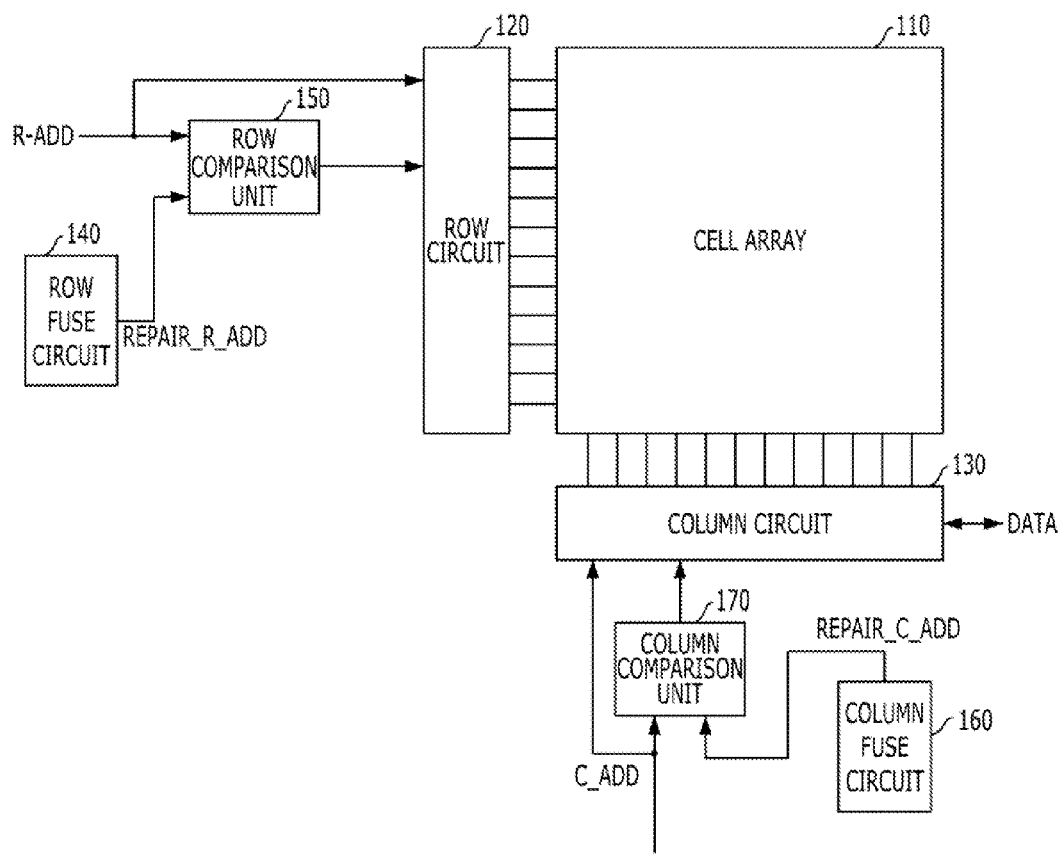
FIG. 1 is a block diagram illustrating a repair operation of a conventional memory device.
Figure 2:
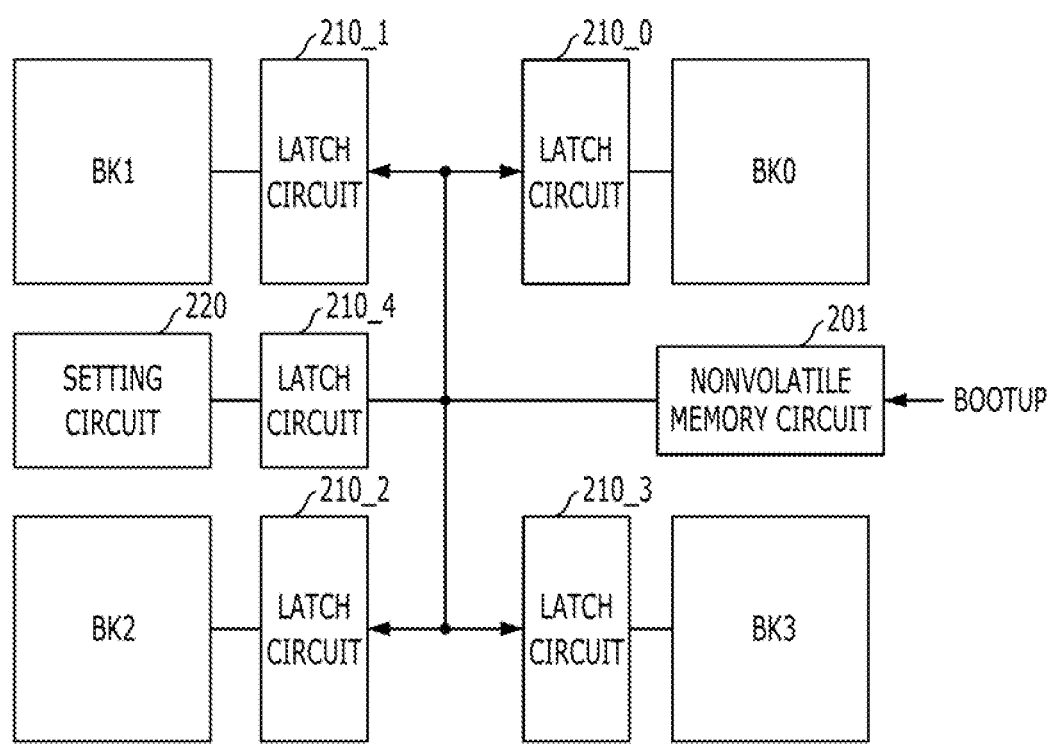
FIG. 2 is a block diagram illustrating a nonvolatile memory circuit storing repair information in a conventional memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to where the first layer is formed directly on the second layer or the substrate but also a case where a third layer exists between the first layer and the second layer or the substrate.

Figure 3:
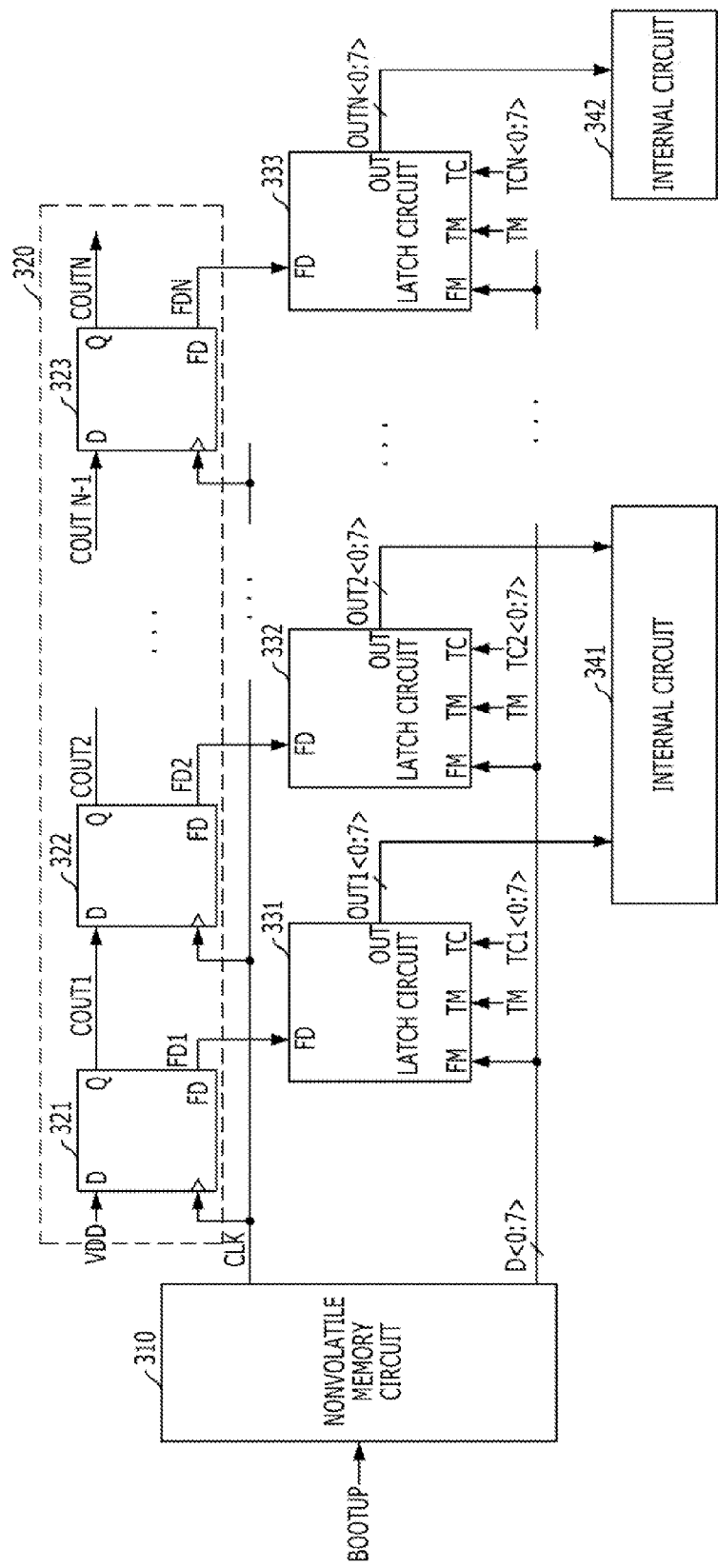
FIG. 3 is a block diagram illustrating an integrated circuit in accordance with an embodiment of the present invention.

FIG. 3 is a block diagram illustrating an integrated circuit in accordance with an embodiment of the present invention.

Referring to FIG. 3, the integrated circuit may include the nonvolatile memory circuit 310, a data bus D<0:7>, a clock line CLK, a shift register 320, the latch circuits 331 to 333, and internal circuits 341 and 342. With reference to FIG. 3, a method for transmitting and storing information stored in a nonvolatile memory circuit 310 into latch circuits 331 to 333 in a boot-up operation will be described.

The nonvolatile memory circuit 310 may store information to be used in the internal circuits 341 and 342 of the integrated circuit. The nonvolatile memory circuit 310 may sequentially output all stored data to the data bus D<0:7> in response to the activation of a boot-up signal BOOTUP. A clock CLK outputted from the nonvolatile memory circuit 310 may be synchronized with data that is transmitted to the data bus D<0:7>. The nonvolatile memory circuit 310 may be one of an E-fuse array circuit, a NAND flash memory, a NOR flash memory, an EPROM, an EEPROM, a FRAM, and a MRAM.

The shift register 320 may sequentially activate first to $N^{th}$ selection signals FD1 to FDN whenever the clock CLK is activated. For example, when selection signal FDX (X is an integer between 1 and N) is activated in response to the clock CLK activation, selection signal FDX+1 may be activated in response to next clock CLK activation. The shift register 320 may include N flip-flop circuits 321 to 323. The flip-flop circuits 321 to 323 may shift signals inputted to terminals D thereof by one clock cycle in synchronization with the clock CLK, and output the signals to terminals Q thereof, respectively. Furthermore, the flip-flop circuits 321 to 323 may generate the selection signals FD1 to FDN, which correspond to the flip-flop circuits 321 to 323, by using the signals inputted to the terminals D, and output the selection signals FD1 to FDN to terminals FD of the flip-flop circuits 321 to 323, respectively. The flip-flop circuits 321 to 323 may be electrically and serially coupled to one another. That is, an output signal Q of a current-staged flip-flop circuit may be an input signal D of a next-staged flip-flop circuit. The flip-flop circuit 321 of the first stage may receive a power supply voltage VDD as an input signal. A detailed description of the flip-flop circuits 321 to 323 will be set forth later with reference to the accompanying drawings.

The latch circuits 331 to 333 may receive and store data of the data bus D<0:7> at the time of the activation of selection signals, which are corresponding to the latch circuits 331 to 333, among the selection signals FD1 to FDN. Each of the latch circuits 331 to 333 may store as much data as the number of bits of the data bus D<0:7>. The latch circuits 331 to 333 may provide the stored data, which is inputted from the data bus D<0:7>, as output signals OUT in a normal operation, but may provide data TC1<0:7> to TCN<0:7>, which is inputted to terminals TC, as the output signals OUT in a test operation in which a test mode signal TM is activated. The data TC1<0:7> to TCN<0:7> inputted to the terminals TC may include data inputted to the exterior of the integrated circuit by a setting in the test operation. For example, when the integrated circuit is a memory device, the data TC1<0:7> to TCN<0:7> inputted to the terminals TC may include data having values decided by an MRS setting and the like in the test operation. A detailed description of the latch circuits 331 to 333 will be set forth later with reference to the accompanying drawings.

The internal circuits 341 and 342 may use the information stored in the latch circuits 331 to 333 of the integrated circuit. For example, the internal circuit 341 may set internal voltage values, which are used in the integrated circuit, by using the information stored in the latch circuits 331 and 332, and the internal circuit 342 may repair an error of the integrated circuit by using the information stored in the latch circuit 333.

According to the embodiment of the present invention, in the boot-up operation where data of the nonvolatile memory circuit 310 is transmitted to the plurality of latch circuits 331 to 333, the selection signals FD1 to FDN are generated by the shift register 320 using the clock line CLK. Data of the data bus D<0:7> is stored in a latch circuit corresponding to an activated selection signal. A simple scheme is provided for selecting a latch circuit, into which data outputted from the nonvolatile memory circuit 310 is to be stored, so that it is possible to minimize the number of lines between the nonvolatile memory circuit 310 and the latch circuits 331 to 333 as well as to minimize the time necessary for the boot-up operation.

Figure 4:
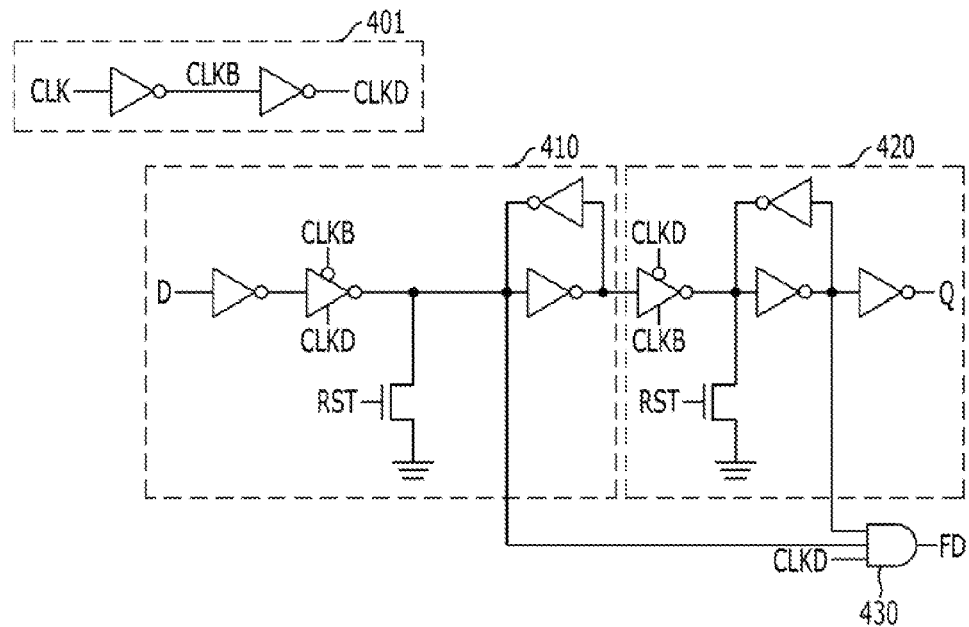
FIG. 4 is a circuit diagram illustrating an example of a flip-flop circuit shown in FIG. 3.

FIG. 4 is a circuit diagram illustrating an example of the flip-flop circuit 321 shown in FIG. 3. The configuration of all of the flip-flop circuits 321 to 323 may be the same as illustrated in FIG. 4.

Referring to FIG. 4, the flip-flop circuit 321 may include a clock input unit 401, a first stage 410, a second stage 420, and a selection signal generation unit 430.

The clock input unit 401 may buffer the clock CLK inputted to a clock terminal. An inverted clock CLKB has a phase opposite to that of the clock CLK, and a clock CLKD indicates a signal obtained by buffering the clock CLK.

The first stage 410 may receive and store a signal inputted to a terminal D thereof when the clock CLKD is at a first level (for example, a 'high' level). When a reset signal RST is activated to the 'high' level, the signal stored in the first stage 410 may be initialized.

The second stage 420 may receive and store a value stored in the first stage 410 when the clock CLKD is at a second level (for example, a 'low' level). When the reset signal RST is activated to the 'high' level, the signal stored in the second stage 420 may be initialized.

The selection signal generation unit 430 may generate the selection signal FD by using the signals stored in the first stage 410 and the second stage 420, and the clock CLKD. The selection signal FD may be activated while the signal of the terminal D stays in the first stage 410 and is not yet transferred to the second stage 420.

Figure 5:
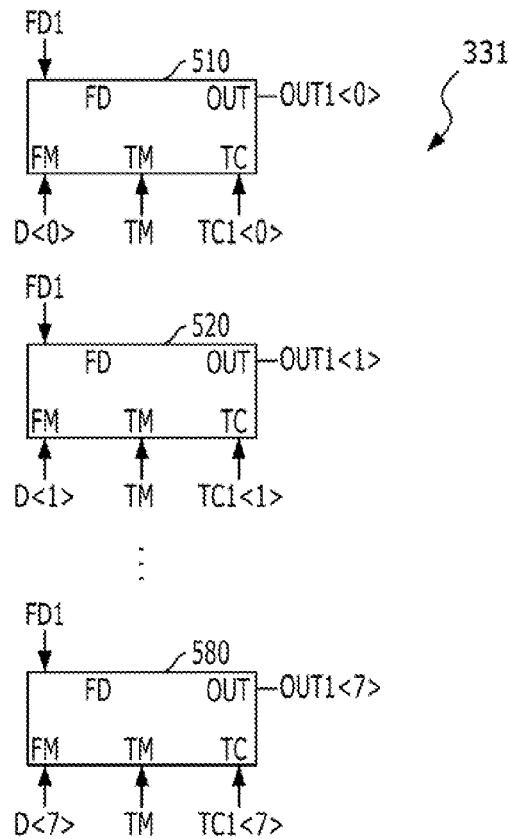
FIG. 5 is a circuit diagram illustrating an example of a latch circuit shown in FIG. 3.

FIG. 5 is a circuit diagram illustrating an example of the latch circuit 331 shown in FIG. 3. The configuration of all of the latch circuits 331 to 333 may be the same as illustrated in FIG. 5.

Referring to FIG. 5, the latch circuit 331 may include 8 latches 510 to 580. Substantially the same signal is inputted to terminals FD and TM of the latches 510 to 580 of the latch circuit 331, but signals different from one another may be inputted/outputted to/from terminals FM, TC, and OUT. That is, each of the latches 510 to 580 of the latch circuit 331 may share each of the selection signals FD1 to FDN and the test mode signal TM, respectively, but receive data loaded on the data bus D<0:7> which is different from one another, receive test data TC1<0:7> different from one another, and have separate output signals OUT1<0:7>.

Figure 6:
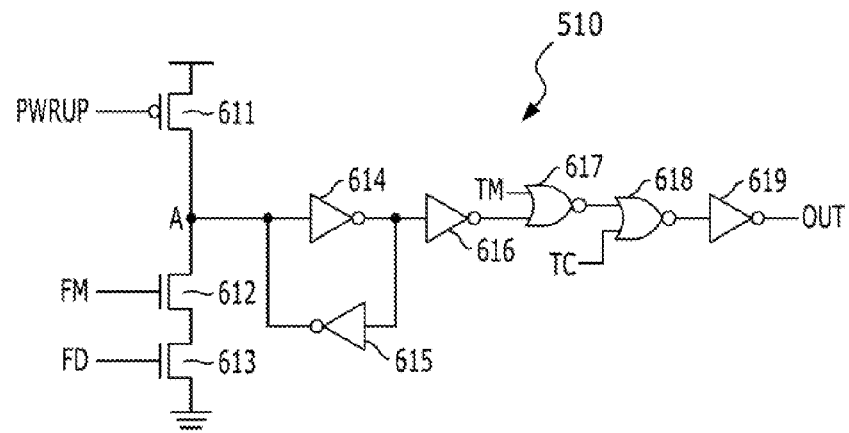
FIG. 6 is a circuit diagram illustrating an example of a latch shown in FIG. 5.

FIG. 6 is a circuit diagram illustrating an example of the latch 510 shown in FIG. 5. The configuration of all of the latches 510 to 580 may be the same as illustrated in FIG. 6.

Referring to FIG. 6 the latch 510 may include transistors 611 to 613, inverters 614 to 619, and NOR gates 617 and 618.

A description for the operation of the latch 510 in a normal mode, in which a signal inputted to a terminal TM and a terminal TC is at a 'low' level, will be set forth. In an initialization operation, when a power-up signal PWRUP is activated to 'low', the transistor 611 may be turned on so that node A may be initialized to 'high'. While a signal inputted to terminal FD is 'high' (that is, while the latch 510 stays selected), when the signal of terminal FM is 'high', node A may change to low level, and when the signal of terminal FM is 'low', node A substantially maintains the 'high' initialization level. Then, an output signal of latch 510 opposite to the node A level may be outputted through terminal OUT. As a consequence, in the normal mode, while the signal of terminal FD stays activated, that is, while the latch 510 stays selected, a signal inputted to the latch 510 through terminal FM may be outputted through terminal OUT as the output signal of latch 510.

In a test mode in which the signal inputted to the terminal TM is at a 'high' level, the signal inputted to the terminal TC may be outputted through terminal OUT as the output signal of the latch 510. That is, in the test mode, test data may be outputted as the output signal of latch 510 regardless of a logic level of a signal stored in latch 510.

Figure 7:
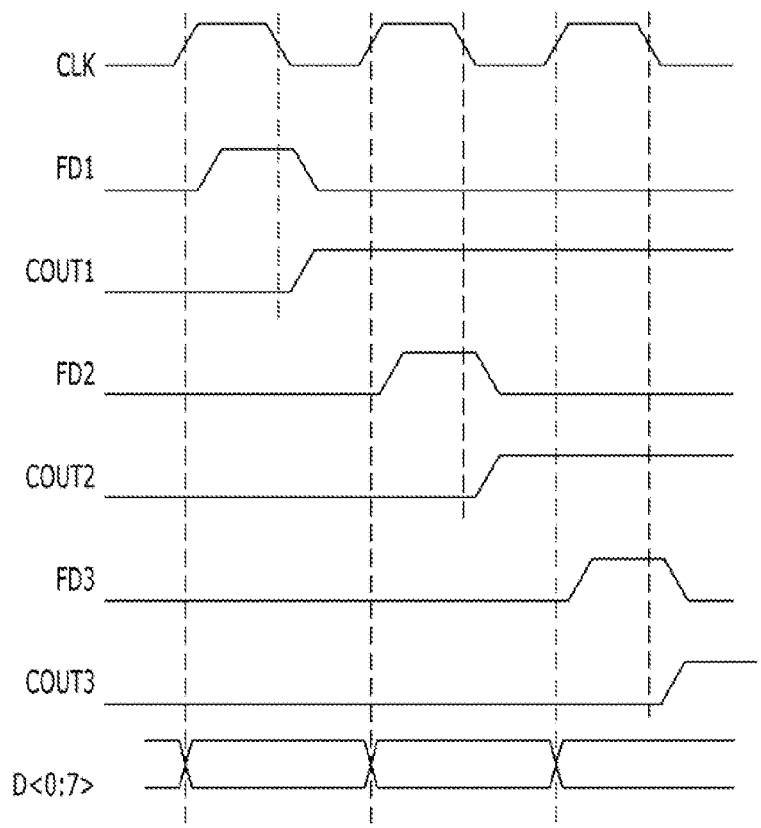
FIG. 7 is a timing diagram illustrating a boot-up operation of an integrated circuit shown in FIGS. 3 to 6.

FIG. 7 is a timing diagram illustrating the boot-up operation of the integrated circuit shown in FIGS. 3 to 6.

Referring to FIG. 7, in response to the first activation of the clock CLK, the flip-flop circuit 321 may activate the selection signal FD1. In response to the activation of the selection signal FD1, data loaded on the data bus D<0:7> may be inputted to and stored in the latch circuit 331. At the time point at which the selection signal FD1 is deactivated, the flip-flop circuit 321 may activate the output signal COUT1 and transfer the activated output signal COUT1 to the flip-flop circuit 322.

In response to the second activation of the clock CLK, the flip-flop circuit 322 may activate the selection signal FD2. In response to the activation of the selection signal FD2, data loaded on the data bus D<0:7> may be inputted to and stored in the latch circuit 332. When the selection signal FD2 is deactivated, the flip-flop circuit 322 may activate the output signal COUT2 and transfer the activated output signal COUT2 to a flip-flop circuit of a next stage.

Similarly, in response to the third activation of the clock CLK, the selection signal FD3 may be activated, and data loaded on the data bus D<0:7> may be stored in a latch circuit corresponding to the selection signal FD3.

Figure 8:
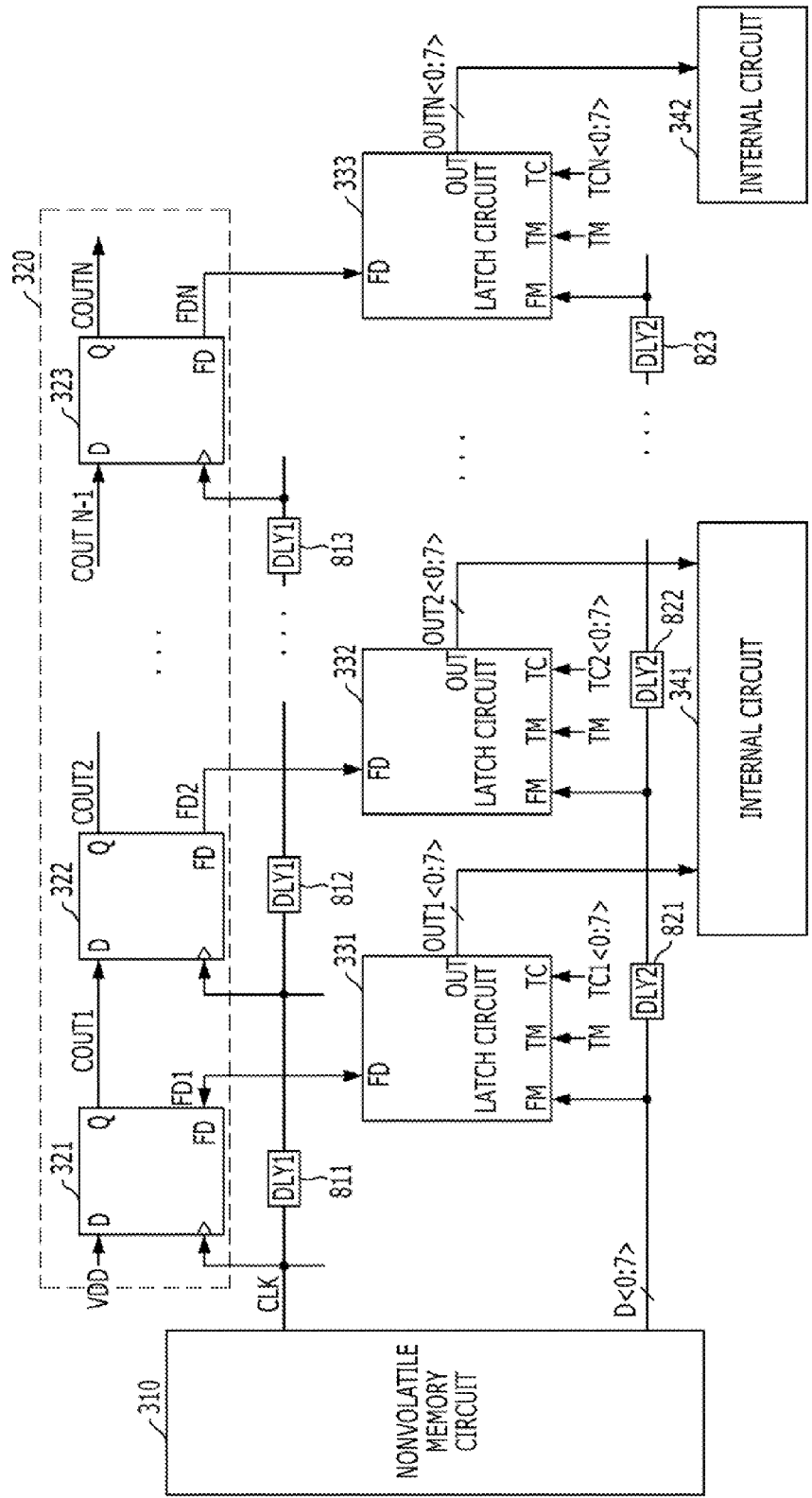
FIG. 8 is a block diagram illustrating an integrated circuit in accordance with another embodiment of the present invention.

FIG. 8 is a block diagram illustrating the integrated circuit in accordance with another embodiment of the present invention.

Referring to FIG. 8, the integrated circuit of another embodiment may further include first delay units 811 to 813 and second delay units 821 to 823, as compared with the integrated circuit described above with reference to FIGS. 3 to 7.

In the integrated circuit, signals COUT1 to COUTN transferred among the flip-flops 321 to 323 of the shift register 320 have good quality due to small loading. However, since a clock CLK and data D<0:7> should be transferred through many elements of the integrated circuit, loading is large, which may result in the deterioration of signal quality. Therefore, a skew difference occurs between the signals COUT1 to COUTN, which may be transferred through the flip-flops 321 to 323, and the clock CLK and the data D<0:7>, which are transferred through the clock line CLK and the data bus D<0:7>, respectively.

The first delay units 811 to 813 may be provided on the clock line CLK, through which the clock CLK is transferred in the integrated circuit, and may delay the clock CLK, thereby compensating for a skew of the clock CLK. The second delay units 821 to 823 may be provided on the data bus D<0:7>, and may delay data transferred through the data bus D<0:7> thereby compensating for a skew of the data bus D<0:7>.

FIG. 8 illustrates the first delay units 811 to 813 and the second delay units 821 to 823, numbers of which are the same as the latch circuits 331 to 333. However, the number of the first delay units 811 to 813 and the number of the second delay units 821 to 823 may be changed according to design.

Figure 9:
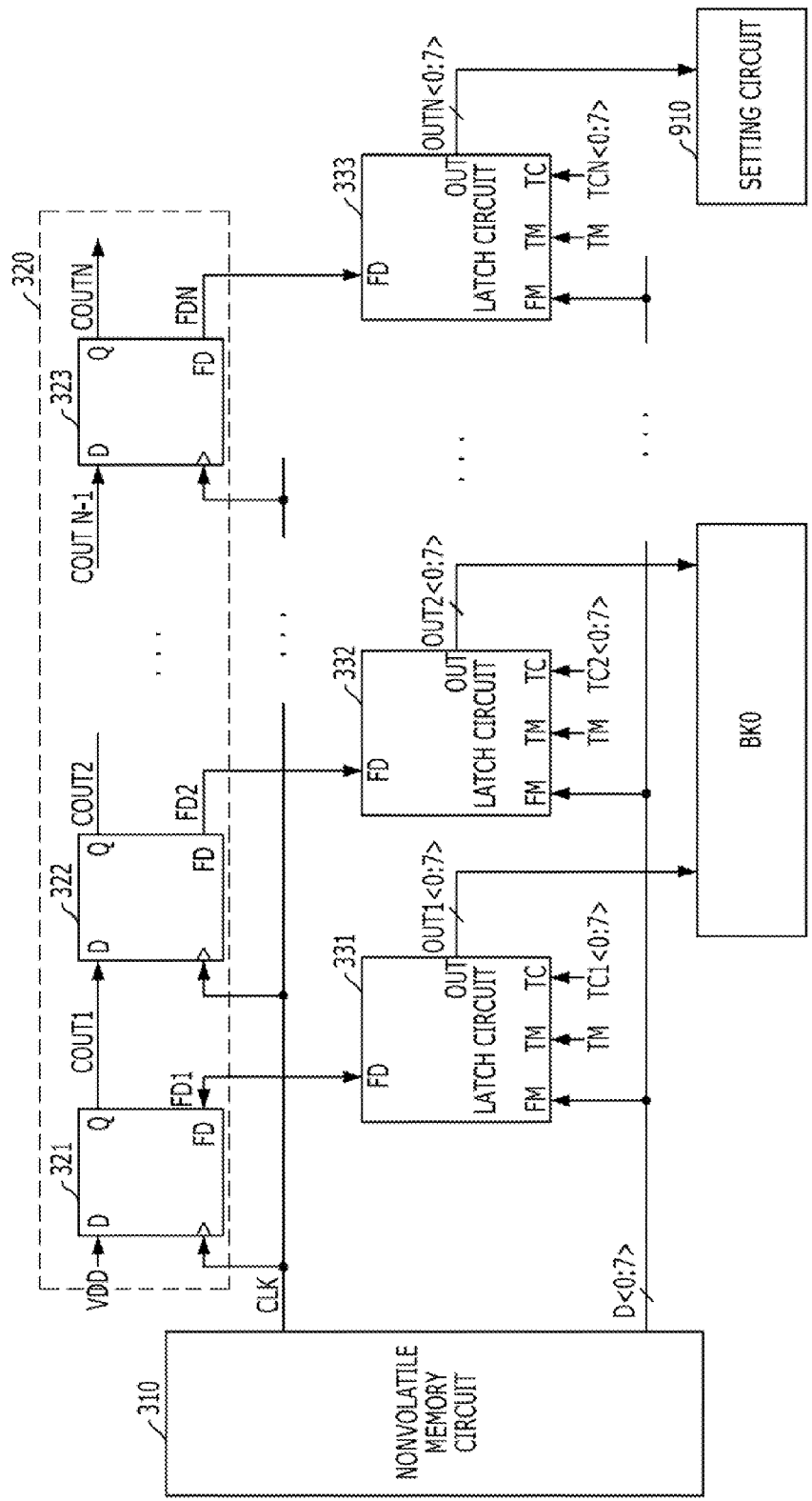
FIG. 9 is a block diagram illustrating a memory device in accordance with an embodiment of the present invention.

FIG. 9 is a block diagram illustrating the memory device in accordance with an embodiment of the present invention.

Referring to FIG. 9, the memory device may include the nonvolatile memory circuit 310, the data bus D<0:7>, the clock line CLK, the shift register 320, the latch circuits 331 to 333, a memory bank BK0, and a setting circuit 910.

The memory bank BK0 may include a cell array and circuits for reading/writing data from/to the cell array. The memory bank BK0 may perform a repair operation for replacing a failed cell in the cell array with a redundancy cell by using stored information outputted from the latch circuits 331 and 332. FIG. 9 illustrates only one memory bank BK0. However, a plurality of memory banks may be provided in the memory device. For example, when the number of the latch circuits 331 to 333 is 1280 (N=1280), four memory banks may be provided in the memory device, wherein each of the memory banks may perform a repair operation by using information stored in 256 latch circuits, and the setting circuit 910 may perform a setting operation by using the information stored in the 256 latch circuits.

The setting circuit 910 may perform a setting operation by using information outputted from the latch circuit 333. For example, the setting circuit 910 may set levels of various internal voltages such as a core voltage or a reference voltage used in the memory device and set various parameter values such as latency of the memory device. The number of latch circuits 333 used in the setting circuit may be changed according to the type of setting operation performed by the setting circuit 910.

FIG. 9 does not illustrate the first delay units 811 to 813 and the second delay units 821 to 823 described above with reference to FIG. 8. However, in order to compensate for a skew the memory device may further include the first delay units 811 to 813 and the second delay units 821 to 823.

Although various embodiments have been described for illustrative purposes, it will be apparent to those skilled in the art that various changes and modifications may be made without departing from the spirit and scope of the invention as defined in the following claims.

What is claimed is:

1. An integrated circuit comprising:
a nonvolatile memory circuit;
  a data bus suitable for transferring data outputted from the nonvolatile memory circuit;
  a shift register suitable for sequentially activating first to N.sup.th selection signals whenever a clock is activated; and
  first to N.sup.th latch circuits corresponding to the first to N.sup.th selection signals, respectively, and suitable for storing data of the data bus in response to activation of the first to N.sup.th selection signals;
  wherein the shift register comprises first to N.sup.th flip-flop circuits electrically and serially coupled to one another, and suitable for generating the first to N.sup.th selection signals, respectively, and
  a clock transfer path suitable for transferring the clock to the first to N.sup.th flip-flop circuits; and one or more first delay units provided on the clock transfer path, and suitable for compensating for a skew of the clock.

2. The integrated circuit of claim 1, wherein the data is transmitted to the data bus in synchronization with the clock.

3. The integrated circuit of claim 1, wherein each of the first to $N^{th}$ latch circuits outputs the data in a normal mode, and outputs a predetermined setting value in a test mode.

4. The integrated circuit of claim 1, further comprising one or more second delay units provided on the data bus, and suitable for compensating for a skew of the data.

5. The integrated circuit of claim 1, wherein the first flip-flop circuit shifts and outputs an initial signal in synchronization with the clock, and generates the first selection signal by using the initial signal, and
  wherein each of the second to $N^{th}$ flip-flop circuits shifts and outputs an output signal of a flip-flop circuit of a previous stage in synchronization with the clock, and generates the corresponding selection signal among the second to $N^{th}$ selection signals by using the output signal of the flip-flop circuit of the previous stage.

6. The integrated circuit, of claim 1, wherein each of the first to $N^{th}$ flip-flop circuits comprises:
  a first stage suitable for receiving and storing an input signal when the clock is at a first level;
  a second stage suitable for receiving, storing, and outputting the signal stored in the first stage when the clock is at a second level; and
  a selection signal generation unit suitable for generating the corresponding selection signal among the first to $N^{th}$ selection signals by using the signals stored in the first stage and the second stage.

7. The integrated circuit of claim 1, further comprising:
  one or more internal circuits using data stored in the first to $N^{th}$ flip-flop circuits.

8. A memory device comprising:
  a nonvolatile memory circuit suitable for storing data including repair data and setting data;
  a data bus suitable for transferring data outputted from the nonvolatile memory circuit;
  a shift register suitable for sequentially activating first to N.sup.th selection signals whenever a clock is activated;
  first to N.sup.th latch circuits corresponding to the first to N.sup.th selection signals, respectively, and suitable for storing data of the data bus in response to activation of the first to N.sup.th selection signals;
  a plurality of memory banks suitable for replacing a failed cell with a redundancy cell by using data stored in one or more of the first to N.sup.th latch circuits; and
  a setting circuit suitable for performing a setting operation by using the data stored in one or more of the first to N.sup.th latch circuits;
  wherein the shift register comprises first to N.sup.th flip-flop circuits electrically and serially coupled to one another, and suitable for generating the first to N.sup.th selection signals, respectively, a clock transfer path suitable for transferring the clock to the first to N.sup.th flip-flop circuits, and one or more first delay units provided on the clock transfer path, and suitable for compensating for a skew of the clock.

9. The memory device of claim 8, wherein the data is transmitted to the data bus in synchronization with the clock.

10. The memory device of claim 8, wherein each of the first to $N^{th}$ latch circuits outputs the data of the data bus in a normal mode, and outputs a predetermined setting value in a test mode.

11. The memory device of claim 8, further comprising one or more second delay units provided on the data bus, and suitable for compensating for a skew of the data.

12. The memory device of claim 8, wherein the first lip-flop circuit shifts and outputs an initial signal in synchronization with the clock, and generates the first selection signal by using the initial signal, and
  wherein each of the second to $N^{th}$ flip-flop circuits shifts and outputs an output signal of a flip-flop circuit of a previous stage in synchronization with the clock, and generates the corresponding selection signal among the second to $N^{th}$ selection signals by using the output signal of the flip-flop circuit of the previous stage.

13. The memory device of claim 8, wherein each of the first to $N^{th}$ flip-flop circuits comprises:
   a first stage suitable for receiving and storing an input signal when the clock is at a first level;
   a second stage suitable for receiving, storing, and outputting the signal stored in the first stage when the clock is at a second level; and
   a selection signal generation unit suitable for generating the corresponding selection signal among the first to $N^{th}$ selection signals by using the signals stored in the first stage and the second stage.

14. The memory device of claim 8, wherein the nonvolatile memory circuit includes one of an E-fuse array circuit, a NAND flash memory, a NOR flash memory, an EPROM, an EEPROM, a FRAM, and a MRAM.

* * * * *